United States Patent
Zhgoon et al.

(10) Patent No.: US 8,490,260 B1
(45) Date of Patent: Jul. 23, 2013

(54) METHOD OF MANUFACTURING SAW DEVICE SUBSTRATES

(75) Inventors: Sergei Zhgoon, Moscow (RU); Kushal Bhattacharjee, Kernersville, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 11/969,956

(22) Filed: Jan. 7, 2008

Related U.S. Application Data

(63) Continuation-in-part of application No. 11/623,939, filed on Jan. 17, 2007, now Pat. No. 7,408,286.

(51) Int. Cl.
*H04R 17/10* (2006.01)
*H01L 21/20* (2006.01)

(52) U.S. Cl.
USPC ............... 29/25.35; 29/594; 438/107

(58) Field of Classification Search
USPC ............ 29/25.35, 594; 438/107, 109, 142, 438/149; 310/313 R, 316, 316.01, 317, 319; 427/249.12; 65/60.1, 60.5
See application file for complete search history.

(56) References Cited

U.S. PATENT DOCUMENTS

| | | | |
|---|---|---|---|
| 3,585,415 A * | 6/1971 | Muller et al. | 310/319 |
| 4,464,639 A | 8/1984 | Staples | |
| 4,898,604 A * | 2/1990 | Sauerwein | 65/60.5 X |
| 5,010,269 A | 4/1991 | Hikita et al. | |
| 5,338,999 A | 8/1994 | Ramakrishnan et al. | |
| 5,446,330 A | 8/1995 | Eda et al. | |
| 5,448,126 A * | 9/1995 | Eda et al. | 310/313 R X |
| 5,453,652 A * | 9/1995 | Eda et al. | 310/313 R |
| 5,682,126 A | 10/1997 | Plesski et al. | |
| 5,815,900 A | 10/1998 | Ichikawa et al. | |
| 5,846,320 A * | 12/1998 | Matsuyama et al. | 427/249.12 X |
| 6,034,578 A | 3/2000 | Fujita et al. | |
| 6,313,568 B1 | 11/2001 | Sullivan et al. | |
| 6,353,372 B1 | 3/2002 | Baier et al. | |
| 6,420,820 B1 | 7/2002 | Larson, III | |
| 6,420,946 B1 | 7/2002 | Bauer et al. | |
| 6,441,539 B1 | 8/2002 | Kitamura et al. | |

(Continued)

FOREIGN PATENT DOCUMENTS

| | | |
|---|---|---|
| JP | 02000932 A | 1/1990 |
| JP | 7086866 A | 3/1995 |

(Continued)

OTHER PUBLICATIONS

Doberstein, S.A. et al., "Balanced Front-End Hybrid SAW Modules with Impedance Conversion," 2002 IEEE Ultrasonics Symposium Proceedings, 2002, 123-126, vol. 1, IEEE.

(Continued)

*Primary Examiner* — A. Dexter Tugbang
(74) *Attorney, Agent, or Firm* — Withrow & Terranova, P.L.L.C.

(57) ABSTRACT

A method of manufacturing composite structures, or composite substrates, for a Surface Acoustic Wave (SAW) device are provided. In one embodiment of the present disclosure, a piezoelectric substrate is provided. A supporting substrate is formed over a first surface of the piezoelectric substrate. The first surface of the piezoelectric substrate may be unpolished. A second surface of the piezoelectric substrate is then processed to a desired thickness and polished. SAW device components such as, for example, interdigitated transducers (IDTs) and reflectors are then formed on the polished surface of the piezoelectric substrate. The supporting substrate may be formed using any desired type of deposition or growth process.

10 Claims, 12 Drawing Sheets

U.S. PATENT DOCUMENTS

| | | | |
|---|---|---|---|
| 6,573,635 | B2 | 6/2003 | Suga et al. |
| 6,599,781 | B1 * | 7/2003 | Li .................................. 438/142 |
| 6,685,168 | B1 | 2/2004 | Stelzl et al. |
| 6,737,941 | B1 | 5/2004 | Tournois |
| 6,754,471 | B1 | 6/2004 | Vakilian |
| 6,759,928 | B2 | 7/2004 | Endou et al. |
| 6,801,100 | B2 | 10/2004 | Nakamura et al. |
| 6,816,035 | B2 * | 11/2004 | Ma et al. .................. 29/25.35 X |
| 6,853,113 | B2 | 2/2005 | Bergmann |
| 6,861,927 | B1 | 3/2005 | Abbott et al. |
| 7,019,435 | B2 | 3/2006 | Nakaya et al. |
| 7,042,313 | B2 | 5/2006 | Yata |
| 7,071,796 | B2 | 7/2006 | Ueda et al. |
| 7,078,989 | B2 | 7/2006 | Inoue et al. |
| 7,101,721 | B2 | 9/2006 | Jorgenson et al. |
| 7,112,912 | B2 | 9/2006 | Inoue et al. |
| 7,126,259 | B2 | 10/2006 | Moler et al. |
| 7,304,553 | B2 | 12/2007 | Bauer et al. |
| 7,358,831 | B2 | 4/2008 | Larson, III et al. |
| 7,528,684 | B1 | 5/2009 | Rao et al. |
| 2003/0155844 | A1 | 8/2003 | Anasako |
| 2004/0104791 | A1 | 6/2004 | Satoh et al. |
| 2004/0164650 | A1 | 8/2004 | Xu et al. |
| 2004/0256624 | A1 | 12/2004 | Sung |
| 2005/0057323 | A1 | 3/2005 | Kando |
| 2005/0099091 | A1 | 5/2005 | Mishima et al. |
| 2006/0138902 | A1 | 6/2006 | Kando |
| 2006/0186556 | A1 | 8/2006 | Sung |
| 2007/0109075 | A1 | 5/2007 | Igaki |
| 2007/0296306 | A1 | 12/2007 | Hauser et al. |

FOREIGN PATENT DOCUMENTS

| | | | |
|---|---|---|---|
| JP | 2005347295 A | * | 12/2005 |
| JP | 2006222512 A | | 8/2006 |
| WO | 2005069486 A1 | | 7/2005 |
| WO | 2005013481 A1 | | 10/2005 |
| WO | 2006032335 A1 | | 3/2006 |

OTHER PUBLICATIONS

International Search Report for PCT/US2008/050627 mailed May 30, 2008.
Kando, Hajime et al., "RF Filter Using Boundary Acoustic Wave," Japanese Journal of Applied Physics, 2006, 4651-4654, vol. 45, No. 5B, The Japan Society of Applied Physics.
Nakamura, Hiroyuki et al., "A Design Technique of Balanced Longitudinal Coupled Mode SAW Filters for RF-stage with a Desired Matching Impendance," 2003 IEEE Ultrasonics Symposium Proceedings, 2003, 2097-2100, IEEE.
Norita, Takao et al., "Wideband Low Loss Double Mode Saw Filters," 1992 IEEE Ultrasonics Symposium Proceedings, 1992, 95-104, IEEE.
Ruppel, C.C.W. et al., "Surface Acoustic Wave Devices for Wireless Area Networks," International Symposium on Acoustic Wave Devices for Future Mobile Communication Systems, Mar. 2001, EPCOS AG, Munich, Germany.
Yamaguchi, Masatsune et al., "Highly Piezoelectric Boundary Waves in Si/SiO2/LiNbO3 Structure," 1998 IEEE International Frequency Control Symposium, 1998, 484-488, IEEE.
Requirement for Restriction/Election mailed Jan. 15, 2008 regarding U.S. Appl. No. 11/431,988 now U.S. Patent No. 7,408,284.
Notice of Allowance mailed Apr. 9, 2008 regarding U.S. Appl. No. 11/431,988 now U.S. Patent No. 7,408,284.
Requirement for Restriction/Election mailed Dec. 8, 2010 regarding U.S. Appl. No. 12/030,666.
Ex parte Quayle Action mailed Mar. 16, 2011 regarding U.S. Appl. No. 12/030,666.
Requirement for Restriction/Election mailed Jan. 15, 2008 regarding U.S. Appl. No. 11/431,986 now U.S. Patent No. 7,449,813.
Nonfinal OA mailed Apr. 7, 2008 regarding U.S. Appl. No. 11/431,986 now U.S. Patent No. 7,449,813.
Notice of Allowance mailed Jul. 18, 2008 regarding U.S. Appl. No. 11/431,986 now U.S. Patent No. 7,449,813.
Nonfinal OA mailed Oct. 22, 2010 regarding U.S. Appl. No. 12/030,711.
Notice of Allowance mailed Dec. 22, 2010 regarding U.S. Appl. No. 12/030,711.
Final Office Action mailed Jan. 20, 2011 regarding U.S. Appl. No. 11/969,956.
Nonfinal OA mailed Jun. 5, 2008 regarding U.S. Appl. No. 11/432,249 now U.S. Patent No. 7,528,684.
Notice of Allowance mailed Dec. 30, 2008 regarding U.S. Appl. No. 11/432,249 now U.S. Patent No. 7,528,684.
Requirement for Restriction/Election mailed Jan. 14, 2008 regarding U.S. Appl. No. 11/431,991 now U.S. Patent No. 7,521,837.
Nonfinal OA mailed Apr. 4, 2008 regarding U.S. Appl. No. 11/431,991 now U.S. Patent No. 7,521,837.
Final Office Action mailed Aug. 21, 2008 regarding U.S. Appl. No. 11/431,991 now U.S. Patent No. 7,521,837.
Notice of Allowance mailed Dec. 16, 2008 regarding U.S. Appl. No. 11/431,991 now U.S. Patent No. 7,521,837.
Nonfinal OA mailed Feb. 19, 2010 regarding U.S. Appl. No. 12/030,735 now U.S. Patent No. 7,849,582.
Notice of Allowance mailed Aug. 6, 2010 regarding U.S. Appl. No. 12/030,735 now U.S. Patent No. 7,849,582.
Sato, H. "Temperature Stable SAW Devices Using Directly Bonded LiTaO3/Glass Substrates," IEEE Ultrasonics Symposium, 1998, pp. 335-339, vol. 1, IEEE.
McKeown, S.A., Mechanical Analysis of Electronic Packaging Systems, 1999, pp. 130-133, Marcel Dekker Inc, ISBN 0-8247-7033-1.
Miracle, D.B. et al, ASM Handbook, vol. 21, Composites, Jan. 31, 2001, pp. 1079, Table 1, ASM International.
Final Office Action for U.S. Appl. No. 12/031,885 mailed Apr. 9, 2012, 8 pages.
Unknown, "US Data for Solids," Aug. 20, 2009, 2 pages, http://www.signal-processing.com/tech/us_data_solid_frame.htm.
Non-final Office Action for U.S. Appl. No. 12/031,885 mailed Oct. 4, 2011, 7 pages.
Non-final Office Action for U.S. Appl. No. 12/014,191 (now US patent 8,011,074) mailed Oct. 19, 2010, 8 pages.
International Search Report for PCT/US2008/050627 mailed May 30, 2008, 3 pages.
BAMR, "Speed of sound through materials velocity of materials," accessed Nov. 28, 2012, 2 pages, http://www.bamr.co.za/velocity%20of%20materials.shtml.
Non-final Office Action for U.S. Appl. No. 12/031,885 mailed Nov. 19, 2012, 11 pages.
Final Office Action for U.S. Appl. No. 12/031,885 mailed Feb. 15, 2013, 9 pages.
Notice of Allowance for U.S. Appl. No. 12/031,885, mailed May 15, 2013, 8 pages.

* cited by examiner

METHOD OF MANUFACTURING SAW DEVICE SUBSTRATES

This application is a Continuation-in-Part (CIP) of U.S. patent application Ser. No. 11/623,939, filed Jan. 17, 2007, the disclosure of which is incorporated herein by reference in its entirety.

FIELD OF THE INVENTION

The present invention relates to Surface Acoustic Wave (SAW) device substrates and methods of manufacturing SAW device substrates.

BACKGROUND OF THE INVENTION

Surface acoustic wave (SAW) devices use one or more interdigitated transducers (IDTs), and perhaps reflectors, provided on a piezoelectric substrate to convert acoustic waves to electrical signals and vice versa. SAW devices are often used in filtering applications for high-frequency signals. Of particular benefit is the ability to create low loss high order bandpass and notch filters without employing complex electrical filter circuits, which may require numerous active and passive components. A common location for a filtering application is in the transceiver circuitry of wireless communication devices.

With reference to FIG. 1, a typical SAW device 10 on a temperature compensated bonded substrate is illustrated. The SAW device 10 will generally only include a piezoelectric substrate 12, which has a surface on which various types of SAW elements, such as IDTs and reflectors, may be formed. In a temperature compensated bonded substrate, the piezoelectric substrate 12 resides on a supporting substrate 14 as shown in FIG. 1. The mechanical and thermal properties of the supporting substrate 14 and the piezoelectric substrate 12 act in conjunction to render the SAW device 10 more stable to temperature variations. As illustrated in this example, a dual-mode SAW (DMS) device is provided, wherein at least two IDTs 16 are placed between two reflectors 18. Both the IDTs 16 and the reflectors 18 include a number of fingers 20 that are connected to opposing bus bars 22. For the reflectors 18, all of the fingers 20 connect to each bus bar 22. For the IDTs 16, alternating fingers 20 are connected to different bus bars 22, as depicted. Notably, the reflectors 18 and IDTs 16 generally have a much larger number of fingers 20 than depicted. The number of actual fingers 20 has been significantly reduced in the drawing figures in an effort to more clearly depict the overall concepts employed in available SAW devices 10 as well as the concepts provided by the present invention.

Notably, the fingers 20 are parallel to one another and aligned within an acoustic cavity, which essentially encompasses the area in which the reflectors 18 and the IDTs 16 reside. In this acoustic cavity, the standing wave or waves generated when the IDTs 16 are excited with electrical signals essentially reside within the acoustic cavity. As such, the acoustic wave energy essentially runs perpendicular across the various fingers 20. In the example illustrated in FIG. 1, one IDT 16 may act as an input while the other IDT 16 may act as an output for electrical signals. Notably, the IDTs 16 and the reflectors 18 are oriented in acoustic series, such that the acoustic wave energy moves along the cavity and perpendicularly across the respective fingers 20 of the IDTs 16 and the reflectors 18.

One issue with the SAW device 10 of FIG. 1 is that the conventional manufacturing process for such a device is expensive. More specifically, as illustrated in FIG. 2, the conventional manufacturing process begins by polishing surfaces of the piezoelectric substrate 12 and the supporting substrate 14. The polished surfaces of the piezoelectric substrate 12 and the supporting substrate 14 are then attached via a direct bonding process or some other similar bonding process. Then, as illustrated in FIG. 3, the piezoelectric substrate 12 is grinded to a desired thickness and polished. While not shown, SAW device elements such as, for example, IDTs 16 and reflectors 18, are then formed on the piezoelectric substrate 12. Because the conventional manufacturing process requires two polishing steps, the process is expensive. Thus, there is a need for an improved process for manufacturing SAW device substrates that eliminates the need for multiple polishing steps. Additionally, the challenges to direct bonding of highly dissimilar materials are sometimes insurmountable and the processes are often expensive.

SUMMARY OF THE INVENTION

The present invention provides composite structures, or composite substrates, for a Surface Acoustic Wave (SAW) device and method of manufacturing the same. In one embodiment, the composite structure includes a supporting substrate formed over a first surface of a piezoelectric substrate. The first surface of the piezoelectric substrate may be unpolished. A second surface of the piezoelectric substrate is then processed to a desired thickness and polished. SAW device components such as, for example, interdigitated transducers (IDTs) and reflectors are then formed on the polished surface of the piezoelectric substrate. The supporting substrate may be formed using any desired type of deposition or growth process such as, for example, vacuum evaporation, sputtering, chemical vapor deposition (CVD), plasma enhanced chemical vapor deposition (PECVD), chemical growth from solutions or melts, electroplating from solutions or melts, cementation of powders with organic and inorganic ingredients, sol-gel route, spraying of materials in powder or other form with and without chemical reactions of components, with and without particle acceleration and means for surface adhesion amelioration, or the like.

In a second embodiment, the composite structure again includes a supporting substrate and the piezoelectric substrate. However, in this embodiment, a first surface of the piezoelectric substrate is first polished and then attached to a carrier substrate. The second surface of the piezoelectric substrate is then grinded to thin the piezoelectric substrate to a desired thickness. The carrier substrate allows the piezoelectric substrate to be thinned to very small thicknesses that would otherwise result in breakage of the piezoelectric substrate due to very small thickness to wafer diameter ratios. The supporting substrate is then formed over a second surface of the piezoelectric substrate. The second surface may be unpolished. The piezoelectric substrate is then detached from the carrier substrate, and SAW device components such as, for example, IDTs and reflectors are formed on the polished surface of the piezoelectric substrate.

In a third embodiment, a composite structure, or composite substrate, includes a supporting substrate between a piezoelectric substrate and a compensation layer. In order to form the composite structure, the supporting substrate and, optionally, the compensation layer are formed over a first surface of the piezoelectric substrate. The first surface of the piezoelectric substrate may be unpolished. The compensation layer may alternatively be attached to the supporting substrate via, for example, direct bonding or a similar process. The second surface of the piezoelectric substrate may then be processed to a desired thickness and polished. Alternatively, the second surface of the piezoelectric substrate may be processed and polished prior to the formation of the supporting substrate and, optionally, the compensation layer. In order to do so, the second surface of the piezoelectric substrate may be polished and then attached to a carrier substrate. After formation of the supporting substrate over the first unpolished surface of the piezoelectric substrate and, optionally, the compensation layer, the piezoelectric substrate is detached from the carrier substrate. SAW device components may then be formed on the polished surface of the piezoelectric substrate.

Preferably, the materials used to form the piezoelectric substrate and the compensation layer in isolation have higher thermal coefficients of expansion (TCE) relative to the TCE of the materials forming the supporting substrate. Once the piezoelectric structure is created, the piezoelectric substrate and the compensation layer tend to expand and contract in a similar manner as temperature changes. As such, the expansion and contraction forces applied to the supporting substrate by the piezoelectric substrate due to temperature changes are substantially countered by opposing forces applied by the compensation layer. Since the expansion or contraction forces on opposing faces of the supporting substrate applied to the supporting substrate by the piezoelectric substrate and the compensation layer are similar, and thus counter one another, the composite structure resists bending or warping as temperature changes. Reducing bending and warping reduces expansion and contraction of the piezoelectric substrate, and thus the effective TCE of the piezoelectric substrate. Preferably, the supporting substrate has a relatively high Young's Modulus to provide sufficient rigidity to withstand the forces applied by the piezoelectric substrate and the compensation layer, and thus further reduces expansion and contraction of the piezoelectric substrate.

Since providing the compensation layer on the opposite side of the supporting substrate reduces the effective TCE of the piezoelectric substrate, the amount of expansion and contraction along the surface of the piezoelectric substrate as temperature changes is reduced. Therefore, the change in spacing, or pitch, between the interdigitated fingers of the IDTs and the reflectors as temperature changes is reduced. Reducing the change in spacing between the interdigitated fingers reduces the effective thermal coefficient of frequency (TCF) of the piezoelectric substrate to improve overall frequency response of the IDTs and the reflectors, and thus the SAW device, as temperature changes. At the same time, the amount of stress in the region of ultrasonic propagation on the surface of the piezoelectric substrate is increased leading to a stronger change in elastic properties, and thus, leading to favorable changes in ultrasonic velocity. Applying larger stress to the piezoelectric substrate leads to improvement of the thermal coefficient of velocity (TCV) to further improve the overall frequency response of the IDTs and the reflectors, and thus the SAW device, as temperature changes.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 4:
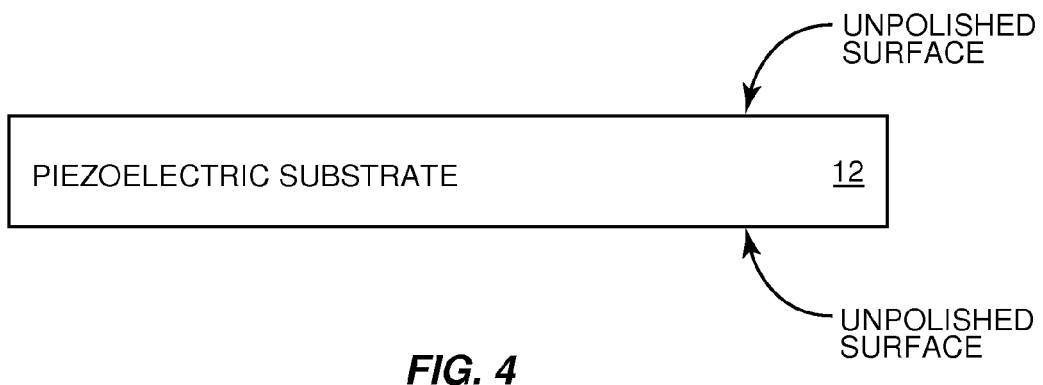
FIGS. 4-7 depict a process of manufacturing a SAW device having a piezoelectric substrate and a supporting substrate according to a first embodiment of the present invention.

FIGS. 4 through 7 illustrate a process of manufacturing a SAW device 10 including a piezoelectric substrate 12 and a supporting substrate 14 according to a first embodiment of the present invention. As illustrated in FIG. 4, the process begins with the piezoelectric substrate 12 having unpolished upper and lower surfaces. The piezoelectric substrate 12 has a relatively high thermal coefficient of expansion (TCE) value relative to that of the supporting substrate 14. While referred to herein as TCE, TCE may alternatively be referred to as a coefficient of thermal expansion (CTE). The isolated TCE value of the piezoelectric substrate 12 may be approximately 10 to 20 parts per million (ppm)/degree Celsius (C) and the Young's Modulus value may be approximately 30 to 500 Giga Pascals (GPa). In a preferred embodiment, the isolated TCE value for the piezoelectric substrate 12 is approximately 16 to 20 ppm/degree C. and the Young's Modulus value is approximately 200 GPa. The piezoelectric substrate 12 may be any single crystal piezoelectric material, such as lithium tantalate, lithium niobate, a deposited piezoelectric thin film, such as, aluminum nitride and zinc oxide, or a piezoceramic, such as lead zirconium titanate (PZT). A deposited piezoelectric thin film may have a non-peizoelectric material on which it is deposited such as glass, silicon, or the like.

Figure 5:
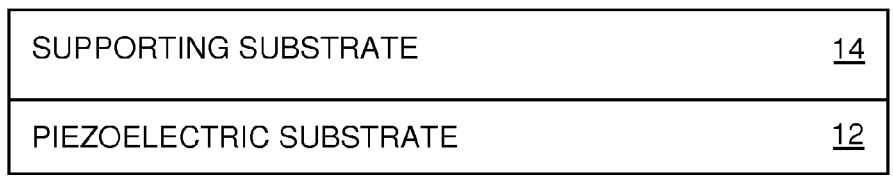

As illustrated in FIG. 5, the supporting substrate 14 is then formed over one of the unpolished surfaces of the piezoelectric substrate 12. With respect to the supporting substrate, as used herein, "forming" is defined as creating or generating via a deposition or growth process and does not include direct bonding or similar bonding or attachment process. The supporting substrate 14 may be formed using any desired type of deposition or growth process such as, for example, vacuum evaporation, sputtering, chemical vapor deposition (CVD), plasma enhanced chemical vapor deposition (PECVD), chemical growth from solutions or melts, electroplating from solutions or melts, cementation of powders with organic and inorganic ingredients, sol-gel route, spraying of materials in powder or other form with and without chemical reactions of components, with and without particle acceleration and means for surface adhesion amelioration, or the like. Preferably, the supporting substrate 14 is formed at room temperature or moderate temperature such as, for example, a temperature in the range of and including 100 degrees Celsius to 200 degrees Celsius in order to prevent substrate damage. Note that by forming the supporting substrate 14 using a growth or deposition process, metals and metal alloys can be introduced into the palette of materials that can be used for the supporting substrate 14, as previously only dielectrics or semiconductors such as silicon were used in such structures.

In general, the supporting substrate 14 has a significantly lower TCE than the piezoelectric substrate 12 and a high Young's Modulus. For example, the isolated TCE value of the supporting substrate 14 may be approximately −10 to 10 ppm/degree C. and the Young's Modulus may be approximately 20 to 1200 GPa, with 100 to 500 GPa being the preferred range. In a preferred embodiment the isolated TCE value of the supporting substrate 14 is approximately less than 4 ppm/degree C. and the Young's Modulus value is approximately 140 GPa. The supporting substrate 14 may be silicon, silicon dioxide, fused silica, sapphire, ceramic alumina, ceramic glass, low TCE glass, diamond, Invar, Elinvar, Kovar, Titanium Niobium Invar, chromium, platinum, palladium based Invar, tungsten, tungsten carbide foil, chromium foil, titanium dioxide doped silica, powder filled or sol-gel based solidifying compositions, or any solid dielectric with a relatively low TCE value, and may be approximately 10 to 1000 µm in thickness. In a preferred embodiment, the supporting substrate 14 is silicon and is approximately 200 to 500 µm in thickness. Note that one or more intermediate layers may be provided between the piezoelectric substrate 12 and the supporting substrate 14 in order to facilitate formation of the supporting substrate 14. For example, one or more adhesion layers and/or stress relieving layers may be formed between the piezoelectric substrate 12 and the supporting substrate 14.

Figure 2:
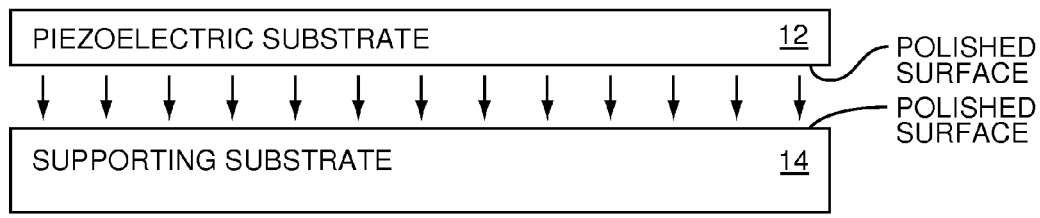
FIGS. 2 and 3 depict a process of manufacturing the SAW device of FIG. 1 according to the prior art.
Figure 3:
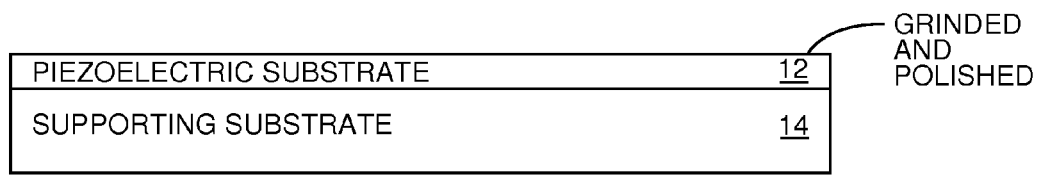
Figure 6:
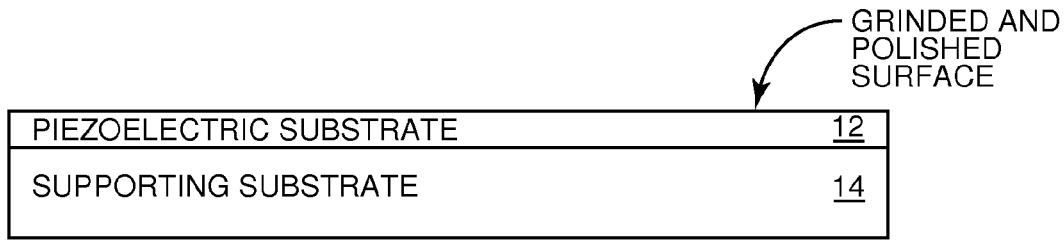
Figure 7:
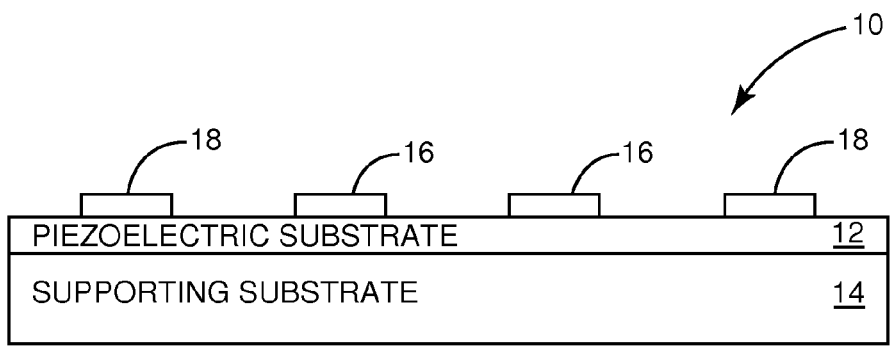

As illustrated in FIG. 6, after the supporting substrate 14 is formed over one of the unpolished surfaces of the piezoelectric substrate 12, the other unpolished surface of the piezoelectric substrate is processed or grinded to a desired thickness and then polished. Then, as shown in FIG. 7, SAW device components such as, for example, interdigitated transducers (IDTs) 16 and reflectors 18 are formed on the polished surface of the piezoelectric substrate 12 in order to form the SAW device 10. Note that the formation process of FIGS. 4 through 7 requires only one polishing step. In addition, preparation of the supporting substrate 14 is altogether avoided. As a result, the SAW device 10 is significantly less expensive to fabricate than a SAW device fabricated with the conventional process of FIGS. 2 and 3.

Figure 8:
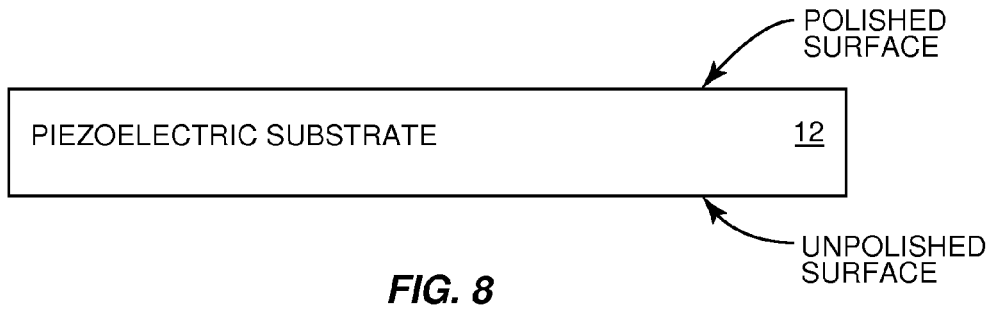
FIGS. 8-12 depict a process of manufacturing a SAW device having a piezoelectric substrate and a supporting substrate according to a second embodiment of the present invention.
Figure 9:
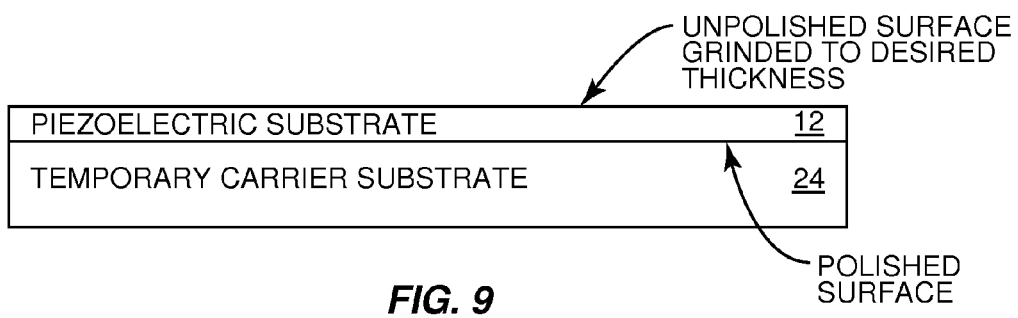
Figure 10:
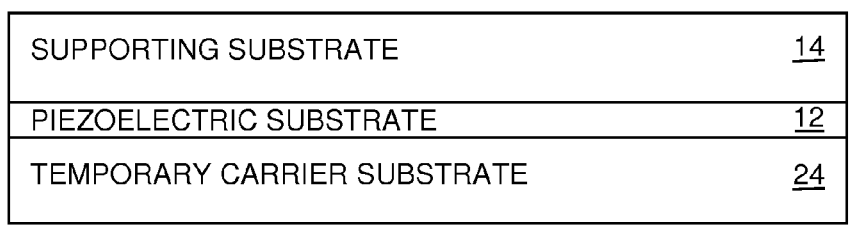
Figure 11:
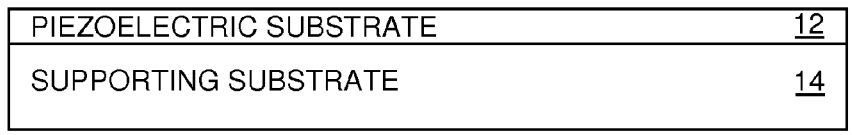
Figure 12:
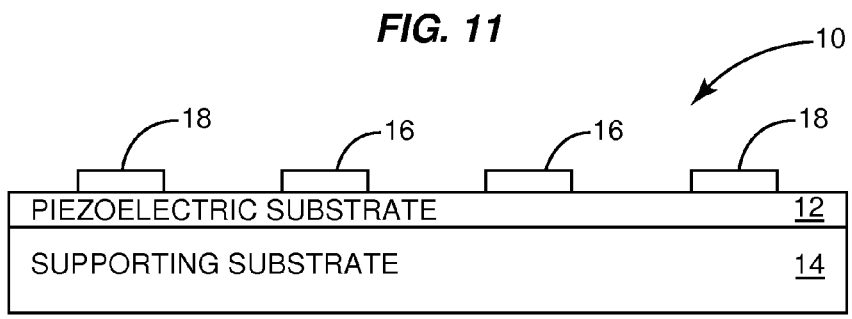

FIGS. 8 through 12 illustrate a process of manufacturing the SAW device 10 having the piezoelectric substrate 12 and the supporting substrate 14 according to a second embodiment of the present invention. As illustrated in FIG. 8, the process begins with the piezoelectric substrate 12. One surface is polished. The other surface of the piezoelectric substrate 12 is preferably unpolished. However, the present invention is not limited thereto. The other surface of the piezoelectric substrate 12 may alternatively be polished. Then, as illustrated in FIG. 9, the polished surface of the piezoelectric substrate 12 is attached to a temporary carrier substrate 24, and the unpolished or unattached side of the piezoelectric substrate 12 is grinded or otherwise processed to thin the piezoelectric substrate 12 to a desired thickness. The piezoelectric substrate 12 may be attached to the temporary carrier substrate 24 by a glue bonding process or the like. As illustrated in FIG. 10, once the piezoelectric substrate 12 is attached to the temporary carrier substrate 24 and processed to the desired thickness, the supporting substrate 14 is formed over the unpolished surface of the piezoelectric substrate 12. Lastly, as shown in FIGS. 11 and 12, the piezoelectric substrate 12 is detached from the temporary carrier substrate 24, and SAW device components are then formed on the polished surface of the piezoelectric substrate 12. Again, note that the formation process of FIGS. 8 through 12 requires only one polishing step. In addition, preparation of the supporting substrate 14, including expensive polishing, is altogether avoided. As a result, the SAW device 10 is significantly less expensive to fabricate than the SAW device fabricated with the conventional process of FIGS. 2 and 3.

Those skilled in the art will recognize that other thicknesses, TCE values, and thermal coefficient of frequency (TCF) values for the piezoelectric substrate 12 and the supporting substrate 14 are applicable. Further, those skilled in the art will recognize that there may be any number of layers in between the piezoelectric substrate 12 and the supporting substrate 14 without departing from the functionality or concepts of the present invention. Further, the piezoelectric substrate 12 and the supporting substrate 14 may include one or more layers of the same or different materials.

Figure 1:
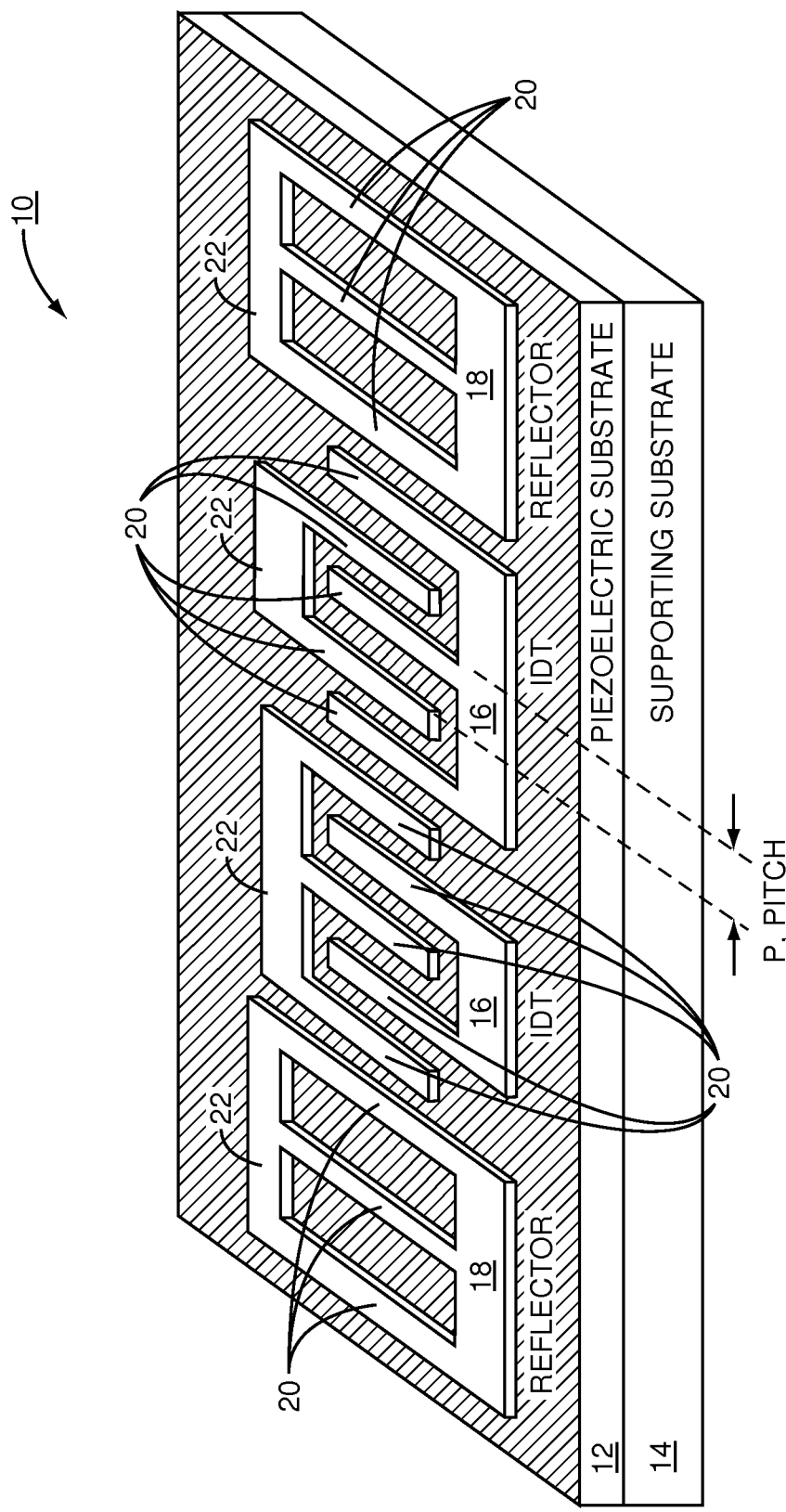
FIG. 1 depicts a perspective view of a SAW device according to the prior art.

Before proceeding to the next aspect of the present invention, the following discussion of the SAW device 10 may be beneficial. Referring again to FIG. 1, the operating frequency of the SAW device 10 is a function of the pitch (P). The pitch is the spacing between the interdigitated fingers 20 of the IDTs 16 and reflectors 18. An objective of most SAW designs is to maintain a consistent frequency response of the SAW device 10. If the spacing changes between the interdigitated fingers 20, the frequency response of the SAW device 10 changes. However, the spacing changes are only a part of the response change. Another factor that significantly affects the frequency response change in the SAW device 10 is the change in SAW velocity which occurs in response to the change in elastic properties of the piezoelectric substrate 12. Unfortunately, piezoelectric substrates 12 generally have a relatively high TCE and a significant dependence on the thermal coefficient of velocity (TCV), and as temperature changes, the piezoelectric substrate 12 will expand and contract and the velocity will increase and decrease. Such expansion and contraction changes the pitch, or spacing, between the fingers 20 as the velocity changes, with temperature variations, in an unfavorable way. Expansion and contraction of the piezoelectric substrate 12, along with an increase and decrease of SAW velocity changes the frequency response of the SAW device 10. The TCF (TCF=TCV−TCE) is a measure of how much the frequency response changes as a function of temperature. Given the need for a SAW device 10 having a frequency response that is relatively constant as temperature changes, there is a need for a piezoelectric substrate 12 that has an effective TCF that is relatively low. To obtain a low TCF, the piezoelectric substrate 12 needs to have a relatively low difference between the effective TCE and the effective TCV. This condition may coincide with simultaneously low TCE and TCV to limit expansion and contraction of the piezoelectric substrate 12 as temperature changes, and simultaneously to limit the changes in wave velocity.

Figure 13A:
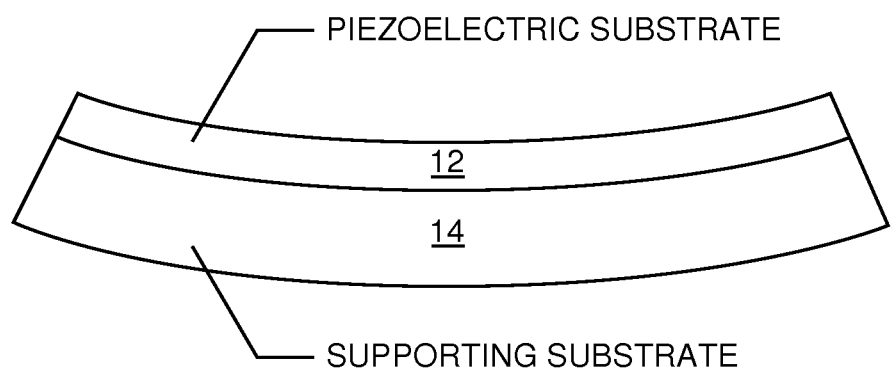
FIGS. 13A and 13B depict a cross sectional view of the bending and warping of the piezoelectric substrate and the supporting substrate during expansion and contraction.
Figure 13B:
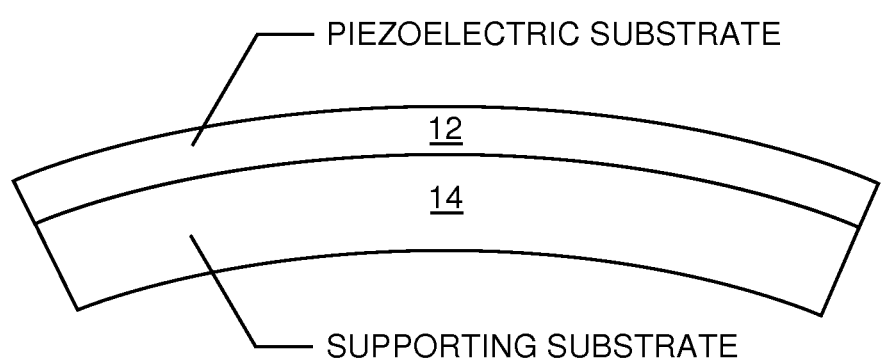

A piezoelectric substrate 12 having a higher TCE also injects issues during manufacturing of the SAW device 10. As noted, the piezoelectric substrate 12 is formed on a supporting substrate 14. The supporting substrate 14 generally has a significantly lower TCE than the piezoelectric substrate 12 and thus will not expand or contract as much as the piezoelectric substrate 12 as temperature changes. As such, the change in velocity is minimal for the supporting substrate 14 as temperature changes. As temperature changes during the manufacturing process, the piezoelectric substrate 12 tends to expand and contract more than the supporting substrate 14, which results in bending or warping of both the supporting substrate 14 and the piezoelectric substrate 12, as shown in FIGS. 13A and 13B. Bent and warped substrates lead to a litany of manufacturing issues during photolithography, dicing, mounting, packaging, and integration of the SAW devices 10 with other semiconductor components. Accordingly, there is a further need for a SAW device 10 with an effective TCE that is relatively low and with simultaneous reduction of warping effects.

Figure 14:
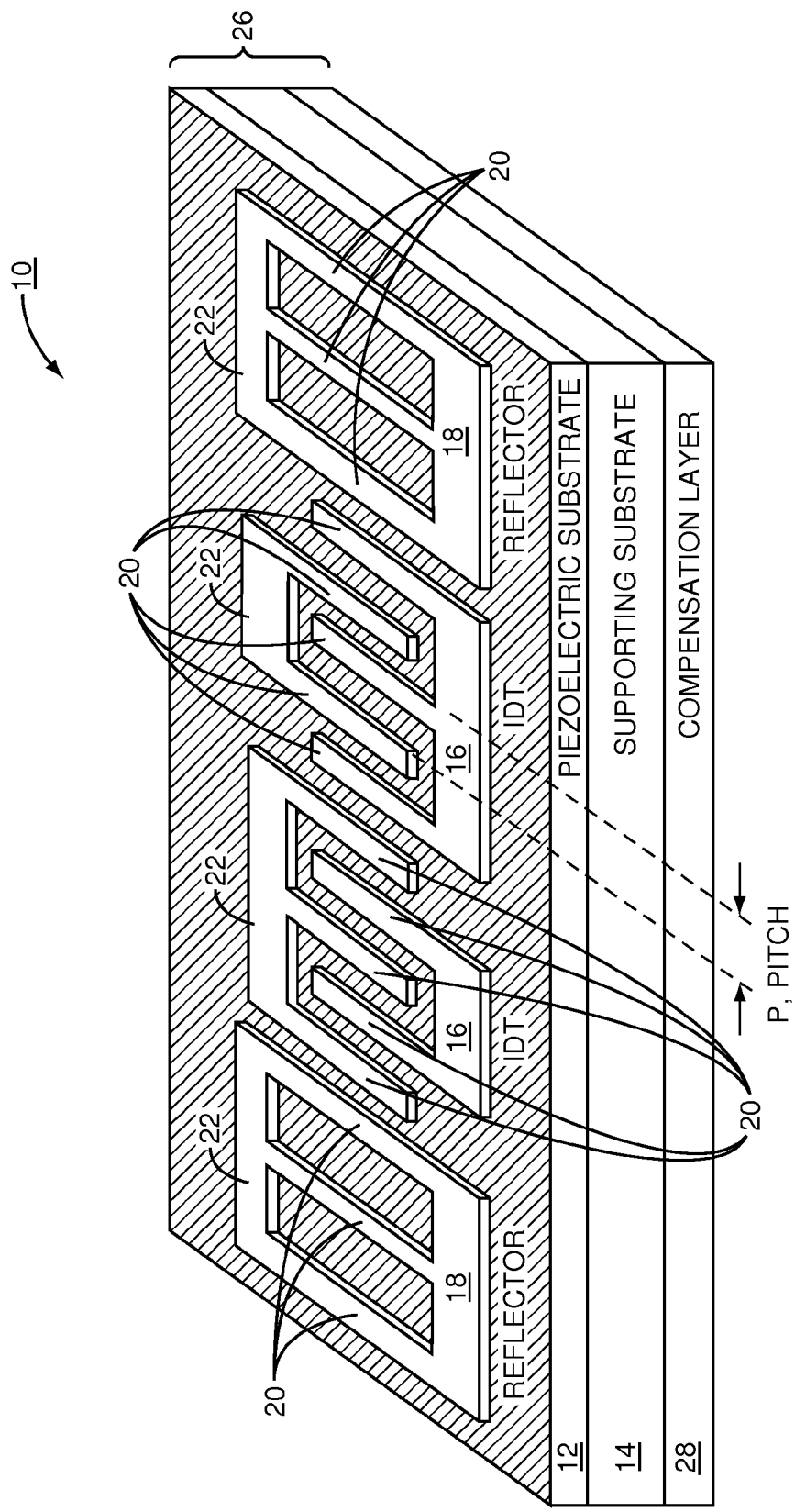
FIG. 14 depicts a perspective view of a SAW device according to one embodiment of the present invention.

With reference to FIG. 14, a SAW device 10 is illustrated according to another embodiment of the present invention. The SAW device 10 will generally include a piezoelectric substrate 12, which has a surface on which various types of SAW elements, such as IDTs and reflectors, may be formed. The piezoelectric substrate 12 resides on a supporting substrate 14. As illustrated in this example, a dual-mode SAW (DMS) device is provided, wherein at least two IDTs 16 are placed between two reflectors 18. Both the IDTs 16 and the reflectors 18 include a number of fingers 20 that are connected to opposing bus bars 22. Here, the reflectors 18 are connected to the same polarity bus bars 22, but may be connected otherwise. For the reflectors 18, all of the fingers 20 connect to each bus bar 22. For the IDTs 16, alternating fingers 20 are connected to different bus bars 22, as depicted. Notably, the reflectors 18 and IDTs 16 generally have a much larger number of fingers 20 than depicted. The number of actual fingers 20 has been significantly reduced in the drawing figures in an effort to more clearly depict the overall concepts employed in available SAW devices 10 as well as the concepts provided by the present invention.

In this embodiment, the SAW device 10 includes a composite structure 26 having a supporting substrate 14 between the piezoelectric substrate 12 and a compensation layer 28. The materials used to form the piezoelectric substrate 12 and the compensation layer 28 in isolation have relatively high TCE relative to the TCE of the materials forming the supporting substrate 14. Once the composite structure 26 is created, the piezoelectric substrate 12 and the compensation layer 28 tend to expand and contract in a similar manner as temperature changes. As such, the expansion and contraction forces applied to the supporting substrate 14 by the piezoelectric substrate 12 due to temperature changes are substantially countered by opposing forces applied by the compensation layer 28. Since the expansion and contraction forces applied to the supporting substrate 14 by the piezoelectric substrate 12 and the compensation layer 28 substantially counter or mirror one another, the composite structure 26 resists bending or warping as temperature changes. Reducing bending and warping reduces expansion and contraction of the topmost surface of the piezoelectric substrate 12, and thus, the effective TCE of the piezoelectric substrate 12. Preferably, the supporting substrate 14 has a relatively high Young's Modulus to provide sufficient rigidity to withstand the forces applied by the piezoelectric substrate 12 and the compensation layer 28, and thus, further reduce expansion and contraction of the piezoelectric substrate 12.

Since providing the compensation layer 28 on the opposite side of the supporting substrate 14 reduces the effective TCE on the topmost surface of the piezoelectric substrate 12, the amount of expansion and contraction along the surface of the piezoelectric substrate 12 as temperature changes is reduced. Therefore, the change in spacing, or pitch, between the interdigitated fingers 20 of the IDTs 16 and the reflectors 18 as temperature changes is reduced. Reducing the change in spacing between the interdigitated fingers 20 reduces the effective TCF of the piezoelectric substrate 12 to improve overall frequency response of the IDTs 16 and the reflectors 18, and thus the SAW device 10, as temperature changes. At the same time, the amount of stress in the region of ultrasonic propagation on the surface of the piezoelectric substrate is increased leading to a stronger change in elastic properties, and thus, leading to favorable changes in ultrasonic velocity reflected in the TCV.

Figure 15:
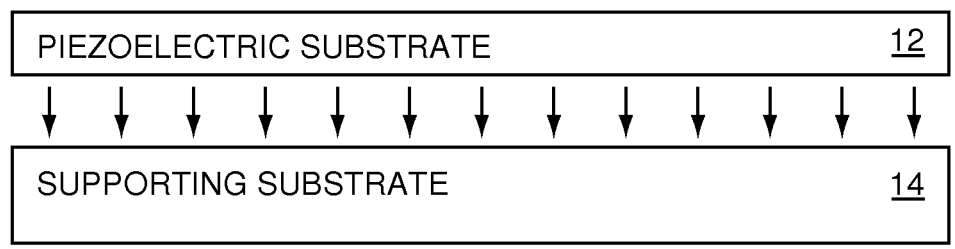
FIGS. 15-18 depict a process of manufacturing the SAW device of FIG. 14 according to a first embodiment of the present invention.

With reference to FIGS. 15-18, a manufacturing process for creating the SAW device 10 of FIG. 14 is provided according to one embodiment of the present invention. Notably, the specific material characteristics provided below are merely exemplary and are not intended to limit the scope of the invention. In FIG. 15, the manufacturing process begins by providing a piezoelectric substrate 12 and a supporting substrate 14. The piezoelectric substrate 12 has a relatively high TCE value relative to the supporting substrate 14. The isolated TCE value of the piezoelectric substrate 12 may be approximately 10 to 20 ppm/degree C. and the Young's Modulus value may be approximately 30 to 500 GPa. In a preferred embodiment, the isolated TCE value for the piezoelectric substrate 12 is approximately 16 to 20 ppm/degree C. and the Young's Modulus value is approximately 200 GPa. The piezoelectric substrate 12 may be any single crystal piezoelectric material, such as lithium tantalate, lithium niobate, a deposited piezoelectric thin film, such as, aluminum nitride and zinc oxide, or a piezoceramic, such as lead zirconium titanate (PZT). In a preferred embodiment, the piezoelectric substrate 12 is lithium tantalate.

The supporting substrate 14 has a relatively low isolated TCE value with respect to the piezoelectric substrate 12 and a high Young's Modulus. For example, the isolated TCE value of the supporting substrate 14 may be approximately −10 to 10 ppm/degree C. and the Young's Modulus may be approximately 20 to 1200 GPa, with 100 to 500 GPa being the preferred range. In a preferred embodiment the isolated TCE value of the supporting substrate 14 is approximately less than 4 ppm/degree C. and the Young's Modulus value is approximately 140 GPa. The supporting substrate 14 may be silicon, silicon dioxide, fused silica, sapphire, ceramic alumina, ceramic glass, low TCE glass, diamond, Invar, Elinvar, Kovar, Titanium Niobium Invar, chromium, platinum, palladium based Invar, tungsten carbide foil, chromium foil, titanium dioxide doped silica, powder filled or sol-gel based solidifying compositions, or any solid dielectric with a relatively low TCE value, and may be approximately 10 to 1000 μm in thickness. In a preferred embodiment, the supporting substrate 14 is silicon and is approximately 200 to 500 μm in thickness.

In FIG. 15, the piezoelectric substrate 12 is bonded or otherwise attached to the top surface of the supporting substrate 14. The bonding method may be organic adhesive bonding, non-organic adhesive bonding, direct bonding, metal layer bonding, metal glue bonding, or the like. As described further below in association with another embodiment, the supporting substrate 14 may also be formed on the piezoelectric substrate 12 by evaporation, CVD, PECVD, sputtering, or similar deposition, growth, or electroplating process. In a preferred embodiment, the bonding method is direct bonding, because it provides more compatibility with typical integrated circuit processing, minimizes contamination, and offers long-term stability of the bond between the piezoelectric substrate 12 and the supporting substrate 14. In a preferred embodiment, the process of bonding the piezoelectric substrate 12 to the supporting substrate 14 occurs at or around room temperature.

Figure 16:
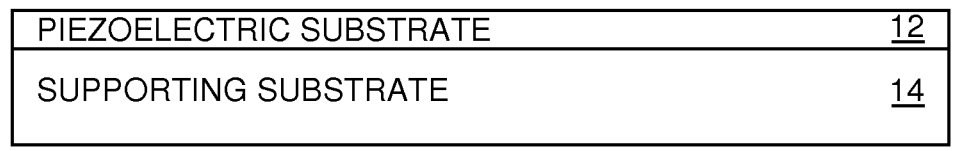

In FIG. 16, the piezoelectric substrate 12 is thinned and polished to approximately 1 to 100% of the supporting substrate's thickness. In a preferred embodiment, the piezoelectric substrate 12 is approximately 5 to 15% of the supporting substrate's thickness. Alternatively, the piezoelectric substrate 12 may be thinned and polished after the compensation layer 28 is subsequently attached to the bottom surface of the supporting substrate 14.

Figures 17, 18:
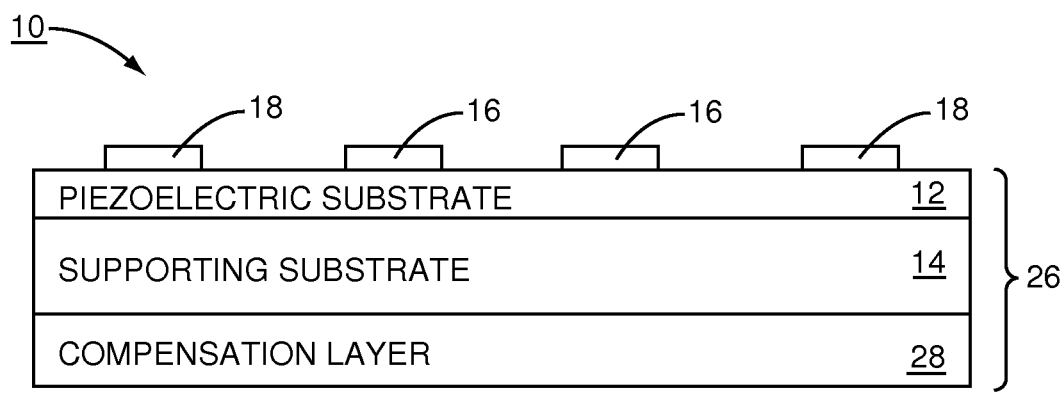

In FIG. 17, the compensation layer 28 is bonded or otherwise attached to the bottom surface of the supporting substrate 14. The compensation layer 28 has a high isolated TCE value relative to that of the supporting substrate 14. The isolated TCE values of the piezoelectric substrate 12 and the compensation layer 28 may be the same or relatively similar. The isolated TCE value of the compensation layer 28 may be approximately 10 to 20 ppm/degree C. and the Young's Modulus may be approximately 30 to 500 GPa. In a preferred embodiment, the isolated TCE value of the compensation layer 28 is approximately 16 to 20 ppm/degree C. and the Young's Modulus value is approximately 200 GPa. The compensation layer 28 may be copper, lithium tantalate, lithium niobate, steel, nickel, aluminum, bronze, any ceramic or any alloy with a relatively high isolated TCE value, or the like, and may be approximately 1 to 100% of the supporting substrate's thickness. In a preferred embodiment, the compensation layer 28 is lithium tantalate and is approximately 5 to 15% of the supporting substrate's thickness. In this case, the crystallographic orientation of the compensation layer 28 may preferably match the crystallographic orientation of the piezoelectric substrate 12 in order to reduce "saddle-shaped" warping related to anisotropic TCE of the piezoelectric substrate. The compensation layer 28 may be bonded to the supporting substrate 14 by organic adhesive bonding, non-organic adhesive bonding, direct bonding, glue bonding, metal layer bonding, or the like. Notably, an intermediate layer may be formed to facilitate bonding. Further, the compensation layer 28 may also be formed on the bottom surface of the supporting substrate 14 by evaporation, CVD, PECVD, sputtering, or like deposition, growth, or electroplating process.

Note that if the compensation layer 28 is made of an isotropic material, the TCE of the compensation layer 28 may be chosen is such a way in comparison to the anisotropic TCE of the piezoelectric substrate 12 so as to optimize the trade-off between remaining warping and the final TCF reduction. For example, if lithium tantalate Y+42 degree cut is used for the piezoelectric substrate 12, it has a TCE of 16 ppm/degree C. in the wave propagation direction and the TCE becomes as low as 8 ppm/degree C. in the perpendicular direction. In this case, a compensation layer 28 with a trade-off TCE of 12 ppm/degree C. results in the least strong averaged magnitude of warping and reasonable TCF improvement. Otherwise, the thickness of the compensation layer 28 may be chosen in such as way that the warping is reduced because the thickness and the Young's modulus define the amount of stress introduced and the amount of compensation accordingly.

The composite structure 26, including the piezoelectric substrate 12, the supporting substrate 14, and the compensation layer 28, has an effective TCE value that is lower than the isolated TCE value of the piezoelectric substrate 12. The effective TCE value of the composite structure 26 may be approximately −10 to 16 ppm/degree C. In a preferred embodiment, the effective TCE value of the composite structure 26 is approximately 0 ppm/degree C. The corresponding effective TCF value of the composite structure 26 may be approximately −10 to 40 ppm/degree C. In a preferred embodiment, the effective TCF value of the composite structure 26 is approximately 0 ppm/degree C. The composite structure 26 may be approximately 20 to 1000 μm in thickness. In a preferred embodiment, the composite structure 26 is approximately 200 to 500 μm in thickness.

Those skilled in the art will recognize that other thicknesses, TCE values, and TCF values for the piezoelectric substrate 12, the supporting substrate 14, the compensation layer 28, and the composite structure 26 are applicable. Although the piezoelectric substrate 12, the supporting substrate 14, and the compensation layer 28 are depicted on top of one another in this example, those skilled in the art will recognize that there may be any number of layers in between those depicted without departing from the functionality or concepts of the present invention. Further, the piezoelectric substrate 12, the supporting substrate 14, and the compensation layer 28 may include one or more layers of the same or different materials.

In FIG. 18, the IDTs 16 and reflectors 18 are formed on the surface of the piezoelectric substrate 12. Next, the SAW device 10 undergoes further processing, which may include wafer level packaging and the like (not shown).

Figure 19:
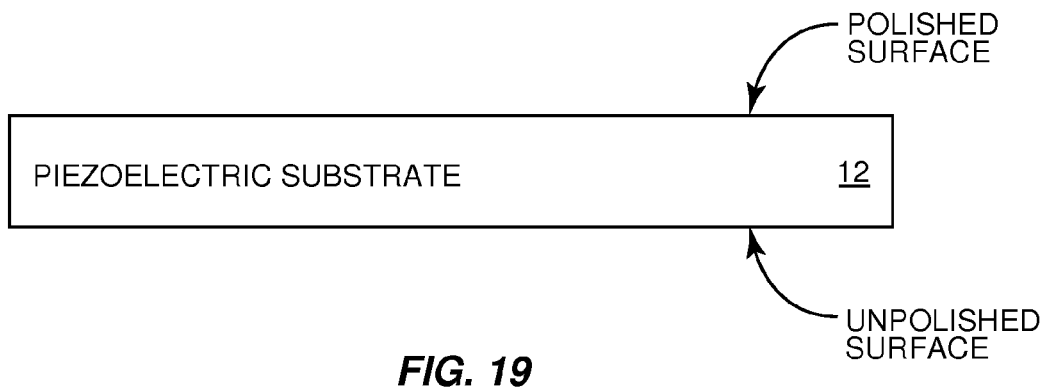
FIGS. 19-24 depict a process of manufacturing the SAW device of FIG. 14 according to a second embodiment of the present invention.
Figure 20:
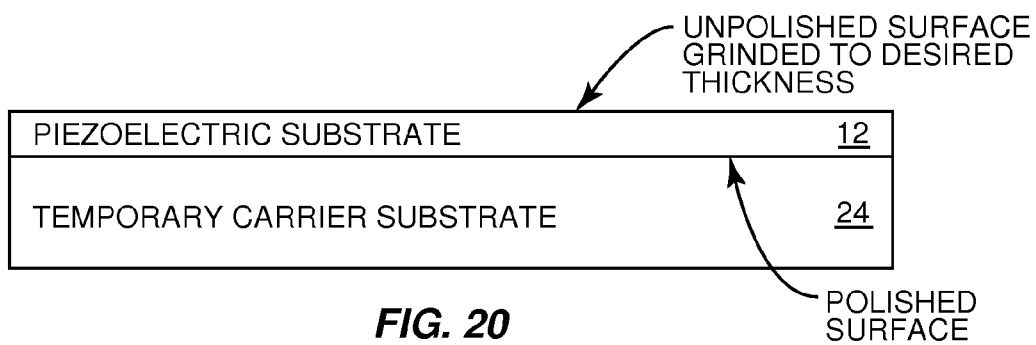

With reference to the graphical representations of FIGS. 19-25, a manufacturing process for creating the SAW device 10 of FIG. 14 is provided according to a second embodiment of the present invention. In the second embodiment, the parameters for the piezoelectric substrate 12, the supporting substrate 14, the compensation layer 28, and the composite structure 26, including TCE values, Young's Modulus values, thicknesses, and materials of composition, remain equivalent to those parameters defined for the first embodiment of the present invention. As illustrated in FIG. 19, the process begins with the piezoelectric substrate 12. One surface is polished. The other surface of the piezoelectric substrate 12 is preferably unpolished. However, the present invention is not limited thereto. The other surface of the piezoelectric substrate 12 may alternatively be polished. Then, as illustrated in FIG. 20, the polished surface of the piezoelectric substrate 12 is attached to a temporary carrier substrate 24, and the unpolished or unattached side of the piezoelectric substrate 12 is grinded or otherwise processed to thin the piezoelectric substrate 12 to a desired thickness. The piezoelectric substrate 12 may be attached to the temporary carrier substrate 24 by a glue bonding process or the like.

Figure 21:
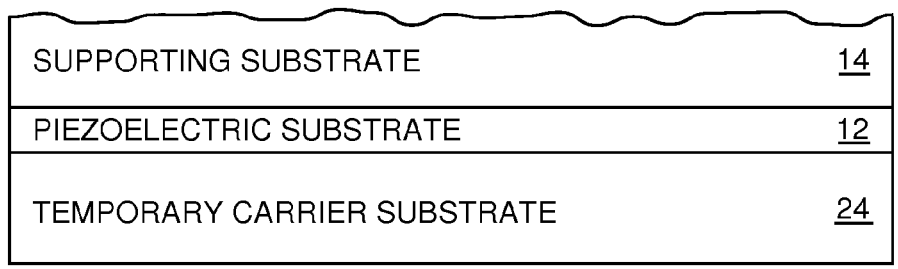

As illustrated in FIG. 21, once the piezoelectric substrate 12 is attached to the temporary carrier substrate 24 and processed to the desired thickness, the supporting substrate 14 is formed over the unpolished surface of the piezoelectric substrate 12. Again, the supporting substrate 14 may be formed using any desired type of deposition or growth process such as, for example, vacuum evaporation, sputtering, chemical vapor deposition (CVD), plasma enhanced chemical vapor deposition (PECVD), chemical growth from solutions or melts, electroplating from solutions or melts, cementation of powders with organic and inorganic ingredients, sol-gel route, spraying of materials in powder or other form with and without chemical reactions of components, with and without particle acceleration and means for surface adhesion amelioration, or the like.

Figure 22:
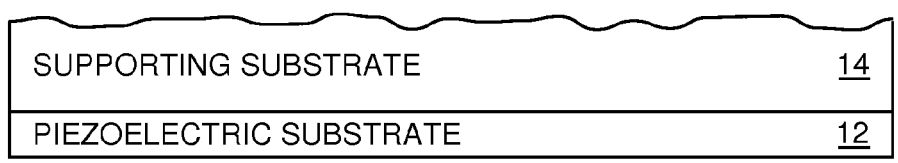
Figure 23:
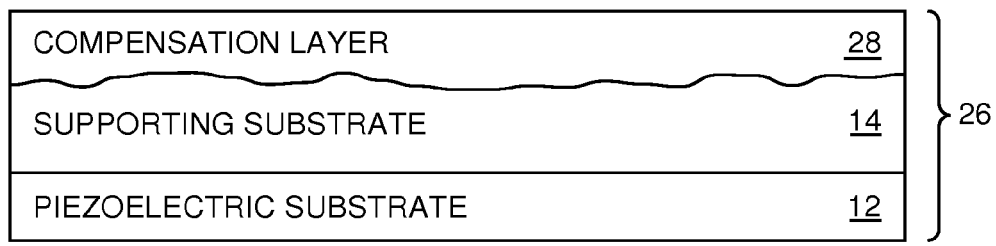
Figure 24:
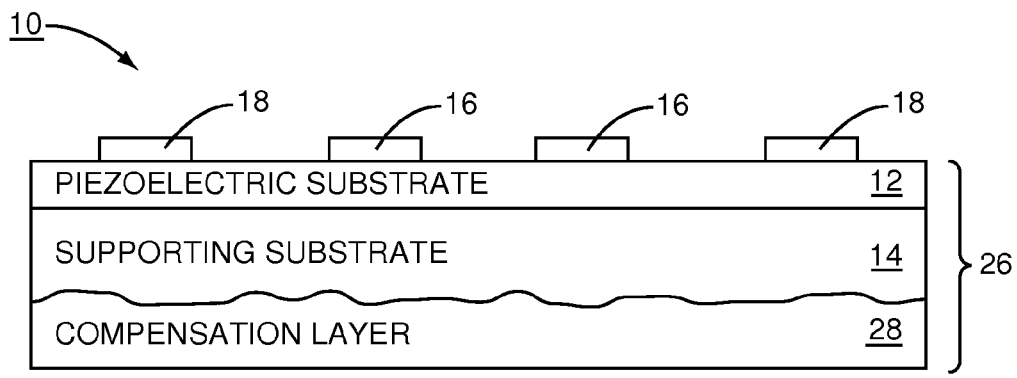

As shown in FIGS. 22 and 23, the piezoelectric substrate 12 is detached from the temporary carrier substrate 24, and the compensation layer 28 is formed on the supporting substrate 14 to provide the composite structure 26. The compensation layer 28 is formed on the top surface of the supporting substrate 14 by electroplating, deposition, sputtering, evaporation, CVD, PECVD, or the like, or bonded to the supporting substrate 14 with cement, metal glue, or the like. Alternatively, the compensation layer 28 may be formed prior to detaching from the temporary carrier substrate 24. Lastly, as shown in FIG. 24, the composite structure 26 is inverted, and the IDTs 16 and reflectors 18 are formed on the polished surface of the piezoelectric substrate 12.

Figure 25:
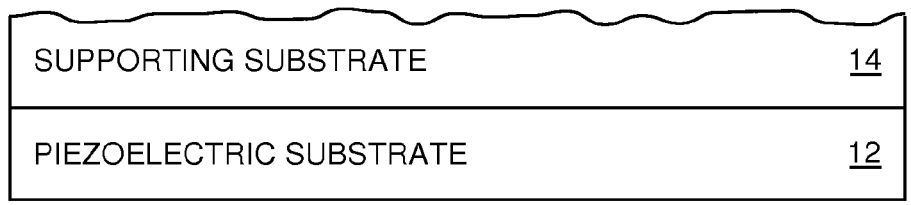
FIGS. 25-28 depict a process of manufacturing the SAW device of FIG. 14 according to a third embodiment of the present invention.

With reference to the graphical representations of FIGS. 25-28, a manufacturing process for creating the SAW device 10 of FIG. 14 is provided according to a third embodiment of the present invention. In the third embodiment, the parameters for the piezoelectric substrate 12, the supporting substrate 14, the compensation layer 28, and the composite structure 26, including TCE values, Young's Modulus values, thicknesses, and materials of composition, remain equivalent to those parameters defined above. In FIG. 25, the supporting substrate 14 is initially formed on the piezoelectric substrate 12 by growing, depositing, electroplating, or otherwise forming the supporting substrate 14 onto the piezoelectric substrate 12. Note that at this point, the piezoelectric substrate 12 is relatively thick and has not been thinned to the desired thickness. Having a relatively thick piezoelectric substrate 12 at this point is desirable to avoid breakage due to a very small thickness to wafer diameter ratio. The surface of the supporting substrate 14 may be machined by lapping or similar methods in order to remove excessive roughness from the surface of the supporting substrate. Notably, some roughness may remain and may even be enhanced by introducing artificial regular or random grooves. The roughness may be beneficial for subsequent compensation layer 28 adhesion or formation.

Figure 26:
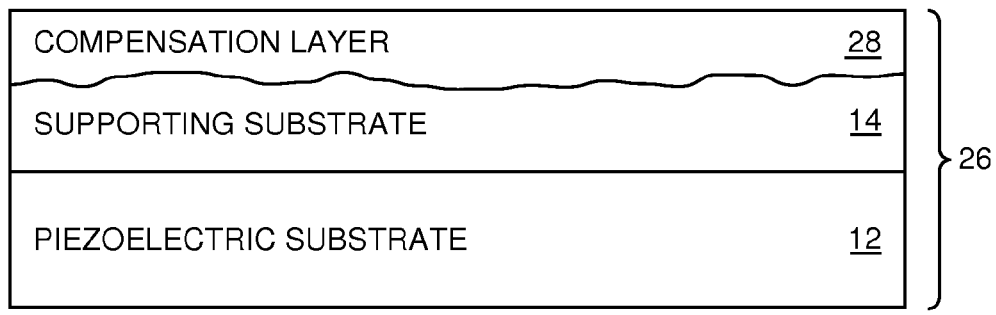
Figure 27:
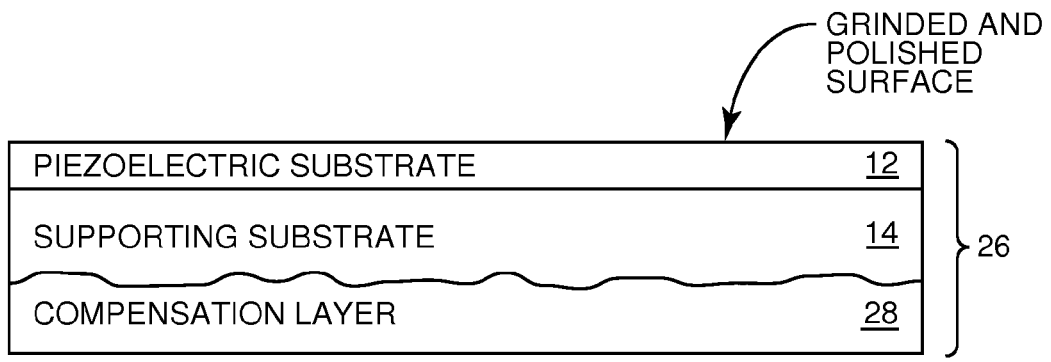
Figure 28:
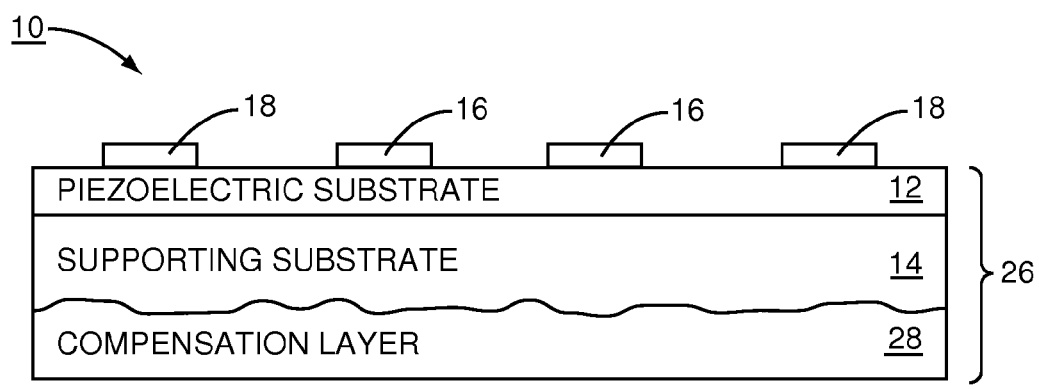

In FIG. 26, the compensation layer 28 is formed on the top surface of the supporting substrate 14 by electroplating, deposition, sputtering, evaporation, CVD, PECVD, or the like, or bonded to the supporting substrate 14 with cement, metal glue, or the like. In FIG. 27, the piezoelectric substrate 12 is thinned to the desired thickness and polished. In FIG. 28, the IDTs 16 and reflectors 18 are formed on the surface of the piezoelectric substrate 12.

Figure 29:
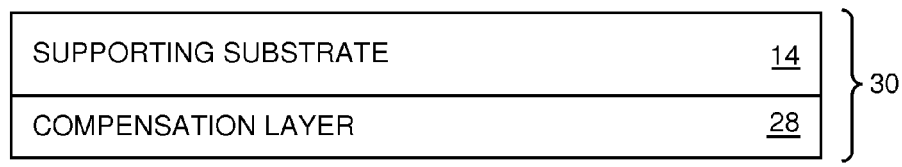
FIGS. 29-31 depict a process of manufacturing the SAW device of FIG. 14 according to a fourth embodiment of the present invention.
Figure 30:
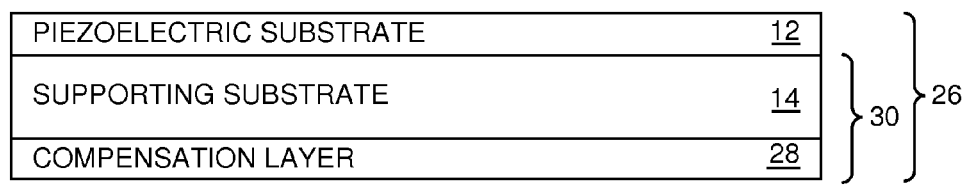
Figure 31:
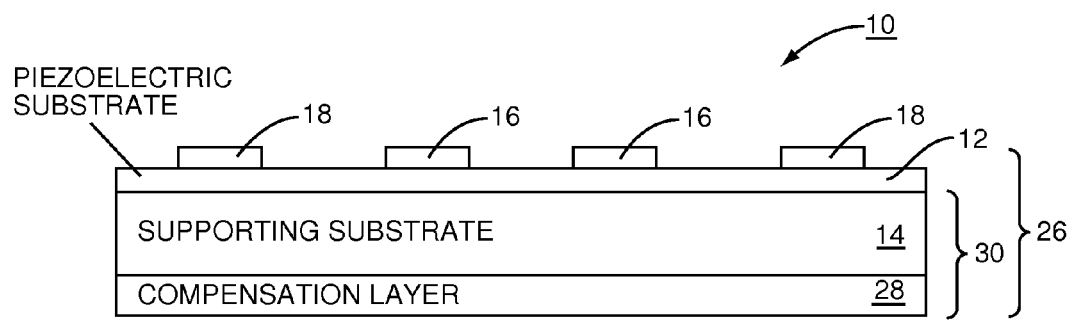

With reference to the graphical representations of FIGS. 29-31, a manufacturing process for creating the SAW device 10 of FIG. 14 is provided according to a fourth embodiment of the present invention. In the fourth embodiment, the parameters for the piezoelectric substrate 12, the supporting substrate 14, the compensation layer 28, and the composite structure 26, including TCE values, Young's Modulus values, thicknesses, and materials of composition, remain equivalent to those parameters defined above. In FIG. 29, the supporting substrate 14 is initially bonded to or formed on the compensation layer 28 to form a compensation structure 30, which may include any number of layers, substrates, or the like. The compensation structure 30 may be formed by any of the following bonding methods. Hot or cold pressing the supporting substrate 14 and the compensation layer 28, followed by soldering and rolling the supporting substrate 14 and the compensation layer 28 together, may create the compensation structure 30. The compensation structure 30 may also be formed by electroplating the supporting substrate 14 onto the compensation layer 28 or vice versa, deposition of the supporting substrate 14 onto the compensation layer 28 by chemical or cementation method, direct bonding, glue bonding, sputtering, CVD, PECVD, or the like. In a preferred embodiment, the method for joining the supporting substrate 14 to the compensation layer 28 is direct bonding, because it provides more compatibility in typical integrated circuit processing, minimizes contamination, and offers long-term stability of the bond between the supporting substrate 14 and the compensation layer 28. In a preferred embodiment, the supporting substrate 14 may be joined to the compensation layer 28 by any hot or low temperature process. Once the supporting substrate 14 is joined to the compensation layer 28, the unbound surface of the supporting substrate 14 is flattened at approximately room temperature to promote a more effective bond with the subsequently bonded piezoelectric substrate 12.

In FIG. 30 the piezoelectric substrate 12 is joined to the compensation structure 30 on top of the supporting substrate 14 of the compensation structure 30. The piezoelectric substrate 12 may be joined to the compensation structure 30 by organic glue, inorganic glue, metal glue, direct bonding, or the like. In a preferred embodiment, the method of bonding the piezoelectric substrate 12 to the compensation structure 30 is direct bonding. In FIG. 31, the piezoelectric substrate 12 is polished and thinned and the IDTs 16 and reflectors 18 are formed on the surface of the piezoelectric substrate 12.

Those skilled in the art will recognize improvements and modifications to the preferred embodiments of the present invention. All such improvements and modifications are considered within the scope of the concepts disclosed herein and the claims that follow.

What is claimed is:

1. A method comprising:
   providing a piezoelectric substrate having a first unpolished surface and a second unpolished surface;
   forming a supporting substrate over the first unpolished surface of the piezoelectric substrate to provide a composite structure, such that the forming the supporting substrate includes at least one of a deposition or a growth process on the first unpolished surface of the piezoelectric substrate;
   polishing the second unpolished surface of the piezoelectric substrate to form a polished second surface after formation of the supporting substrate over the first unpolished surface; and
   forming at least one Surface Acoustic Wave (SAW) device component on the polished second surface of the piezoelectric substrate after polishing the second unpolished surface of the piezoelectric substrate.

2. The method of claim 1 wherein forming the supporting substrate comprises forming the supporting substrate over the first unpolished surface of the piezoelectric substrate at room temperature.

3. The method of claim 1 wherein the piezoelectric substrate is formed from a deposited piezoelectric thin film material.

4. The method of claim 1 wherein the piezoelectric substrate has a thermal coefficient of expansion (TCE) in a range of and including 10 to 20 parts per million (ppm)/degree Celsius.

5. The method of claim 1 wherein the supporting substrate is formed from at least one of a group consisting of: silicon, silicon dioxide, fused silica, sapphire, ceramic alumina, ceramic glass, low thermal coefficient of expansion (TCE) glass, diamond, invar, elinvar, kovar, titanium niobium invar, chromium, platinum, palladium based invar, tungsten, carbide foil, chromium foil, titanium dioxide doped silica, powder filled composition, and sol-gel based solidifying composition.

6. The method of claim 1 wherein the supporting substrate has an isolated thermal coefficient of expansion (TCE) in a range of and including −10 to 10 parts per million (ppm)/degree Celsius.

7. The method of claim 1 wherein the supporting substrate has a Young's Modulus in a range of and including 20 to 1200 Giga Pascals (GPa).

8. The method of claim 1 wherein the supporting substrate has an isolated thermal coefficient of expansion (TCE) that is significantly less than an isolated TCE of the piezoelectric substrate.

9. The method of claim 1 wherein forming the supporting substrate comprises forming the supporting substrate over the first unpolished surface of the piezoelectric substrate using a process selected from a group consisting of: vacuum evaporation, sputtering, chemical vapor deposition (CVD), plasma enhanced chemical vapor deposition (PECVD), chemical growth from solutions or melts, electroplating from solutions or melts, cementation of powders with organic and inorganic ingredients, sol-gel route, and spraying.

10. The method of claim 1 wherein the piezoelectric substrate is formed from a piezoceramic material.

* * * * *